(12) United States Patent
Nam et al.

(10) Patent No.: US 11,798,788 B2
(45) Date of Patent: Oct. 24, 2023

(54) HOLLOW CATHODE, AN APPARATUS INCLUDING A HOLLOW CATHODE FOR MANUFACTURING A SEMICONDUCTOR DEVICE, AND A METHOD OF MANUFACTURING A SEMICONDUCTOR DEVICE USING A HOLLOW CATHODE

(71) Applicant: SAMSUNG ELECTRONICS CO., LTD., Suwon-si (KR)

(72) Inventors: Sang Ki Nam, Seongnam-si (KR); Sunggil Kang, Hwaseong-si (KR); Sungyong Lim, Seoul (KR); Beomjin Yoo, Hwaseong-si (KR); Akira Koshiishi, Hwaseong-si (KR); Vasily Pashkovskiy, Suwon-si (KR); Kwangyoub Heo, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 526 days.

(21) Appl. No.: 17/091,433

(22) Filed: Nov. 6, 2020

(65) Prior Publication Data

US 2021/0057193 A1    Feb. 25, 2021

Related U.S. Application Data

(63) Continuation of application No. 15/991,500, filed on May 29, 2018, now abandoned.

(30) Foreign Application Priority Data

Oct. 23, 2017  (KR) .................. 10-2017-0137420

(51) Int. Cl.
*H01L 21/3065* (2006.01)
*H01J 37/32* (2006.01)
*H01J 1/02* (2006.01)

(52) U.S. Cl.
CPC ........ *H01J 37/32596* (2013.01); *H01J 1/025* (2013.01); *H01J 37/32009* (2013.01); *H01J 37/32899* (2013.01)

(58) Field of Classification Search
None
See application file for complete search history.

(56) References Cited

U.S. PATENT DOCUMENTS 6,182,604 B1   2/2001   Goeckner et al.
7,543,546 B2   6/2009   Shibata et al.
(Continued)

FOREIGN PATENT DOCUMENTS

CN   1700953        11/2005
CN   105390356      3/2016
(Continued)

OTHER PUBLICATIONS

Office Action dated Aug. 6, 2020 In Corresponding U.S. Appl. No. 15/991,500.

*Primary Examiner* — Roberts P Culbert
(74) *Attorney, Agent, or Firm* — F. Chau & Associates, LLC

(57) ABSTRACT

A hollow cathode includes an insulation plate having cathode holes. Bottom electrodes are below the insulation plate. The bottom electrodes define first holes having a width greater than a width of the cathode holes. Top electrodes are at an opposite side of the insulation plate from the bottom electrodes. The top electrodes define second holes aligned with the first holes along a direction orthogonal to the upper surface of the insulation plate.

20 Claims, 14 Drawing Sheets

(56) References Cited

U.S. PATENT DOCUMENTS

| | | |
|---|---|---|
| 8,574,445 B2 | 11/2013 | Cho et al. |
| 8,900,402 B2 | 12/2014 | Holland et al. |
| 9,190,249 B2 | 11/2015 | Dybek et al. |
| 9,190,289 B2 | 11/2015 | Hudson |
| 9,406,535 B2 | 8/2016 | Berry, III et al. |
| 9,431,218 B2 | 8/2016 | Zhao et al. |
| 10,347,468 B2 | 7/2019 | Lee et al. |
| 11,062,920 B2 | 7/2021 | Berry, III et al. |
| 2001/0006093 A1 | 7/2001 | Tabuchi et al. |
| 2006/0042545 A1 | 3/2006 | Shibata et al. |
| 2006/0082319 A1 | 4/2006 | Eden et al. |
| 2007/0163440 A1 | 7/2007 | Kim et al. |
| 2009/0015160 A1 | 1/2009 | Rueger et al. |
| 2009/0218212 A1 | 9/2009 | Denpoh et al. |
| 2012/0255678 A1 | 10/2012 | Holland et al. |
| 2012/0258555 A1 | 10/2012 | Holland et al. |
| 2014/0265846 A1 | 9/2014 | Zhao et al. |
| 2015/0044878 A1 | 2/2015 | Holland et al. |
| 2015/0318185 A1* | 11/2015 | Kodaira .................. H01L 22/20 156/345.28 |
| 2017/0140904 A1 | 5/2017 | Chambers et al. |
| 2019/0122860 A1 | 4/2019 | Lee et al. |
| 2019/0122866 A1 | 4/2019 | Nam et al. |
| 2019/0122867 A1 | 4/2019 | Nam et al. |

FOREIGN PATENT DOCUMENTS

| | | |
|---|---|---|
| JP | 2005-072347 | 3/2005 |
| KR | 10-2005-0054984 | 6/2005 |
| KR | 10-2008-0037917 | 5/2008 |
| KR | 100895630 | 4/2009 |
| KR | 101092881 | 12/2011 |
| KR | 101151225 | 5/2012 |
| KR | 101181709 | 9/2012 |
| KR | 10-2016-0026770 | 3/2016 |

* cited by examiner

HOLLOW CATHODE, AN APPARATUS INCLUDING A HOLLOW CATHODE FOR MANUFACTURING A SEMICONDUCTOR DEVICE, AND A METHOD OF MANUFACTURING A SEMICONDUCTOR DEVICE USING A HOLLOW CATHODE

CROSS-REFERENCE TO RELATED APPLICATION

This U.S. non-provisional patent application is a continuation of U.S. patent application Ser. No. 15/991,500 filed on May 29, 2018, which claims priority under 35 U.S.C § 119 to Korean Patent Application No. 10-2017-0137420 filed on Oct. 23, 2017, the disclosures of which are incorporated by reference herein in their entirety.

TECHNICAL FIELD

Exemplary embodiments of the present inventive concept relate to a hollow cathode, and more particularly to an apparatus including a hollow cathode for manufacturing a semiconductor device, and a method of manufacturing a semiconductor device using a hollow cathode.

DISCUSSION OF RELATED ART

In general, a semiconductor device may be manufactured by employing a plurality of unit processes. The unit processes may include a thin-layer deposition process, a lithography process, and an etching process. Plasma may be used to perform the thin-layer deposition process and the etching process. The plasma may treat substrates at relatively high temperatures. Relatively high frequency power is generally used to produce the plasma.

SUMMARY

An exemplary embodiment of the present inventive concept provides a hollow cathode capable of generating pixelated plasma and an apparatus for manufacturing a semiconductor device. The apparatus for manufacturing the semiconductor device is equipped with the hollow cathode.

An exemplary embodiment of the present inventive concept provides a method of manufacturing a semiconductor device. The method increases etch uniformity.

According to an exemplary embodiment of the present inventive concept, a hollow cathode includes an insulation plate having cathode holes. Bottom electrodes are below the insulation plate. The bottom electrodes define first holes having a width greater than a width of the cathode holes. Top electrodes are at an opposite side of the insulation plate from the bottom electrodes. The top electrodes define second holes aligned with the first holes along a direction orthogonal to the upper surface of the insulation plate.

According to an exemplary embodiment of the present inventive concept, an apparatus for manufacturing a semiconductor device includes a chamber and an electrostatic chuck in the chamber. A hollow cathode is in the chamber. The hollow cathode is disposed above the electrostatic chuck. The hollow cathode includes an insulation plate having cathode holes. Bottom electrodes are below the insulation plate. The bottom electrodes define first holes having a width greater than a width of the cathode holes. Top electrodes are at opposite sides of the insulation plate from the bottom electrodes. The top electrodes define second holes aligned with the first holes along a direction orthogonal to an upper surface of the insulation plate.

According to an exemplary embodiment of the present inventive concept, a method of manufacturing a semiconductor device includes obtaining a measurement of etch uniformity of a substrate by detecting a difference in etch rate depending on locations on the substrate. The method includes determining positions of bottom electrodes and top electrodes of a hollow cathode that are configured to be individually supplied with a source power and a bias power according to the detected differences in etch rate depending on locations on the substrate. The method includes locally generating a plasma on the substrate by selectively providing the source power and the bias power to the bottom electrodes and the top electrodes based on the differences in etch rate depending on locations on the substrate.

According to an exemplary embodiment of the present inventive concept, an apparatus for etching a semiconductor device includes an etching chamber and an electrostatic chuck positioned in the etching chamber. A plurality of reaction gas chambers are positioned above the etching chamber. Each of the reaction gas chambers is individually connected to a gas supply. The reaction gas chambers are separated from each other by partitions. A hollow cathode is positioned between the etching chamber and the plurality of reaction gas chambers. The hollow cathode includes a plurality of cathode holes positioned over the electrostatic chuck. The hollow cathode includes upper and lower electrodes adjacent to each cathode hole of the plurality of cathode holes. The upper and lower electrodes are disposed on an insulation plate.

BRIEF DESCRIPTION OF THE DRAWINGS

The above and other features of the inventive concept will become more apparent by describing in detail exemplary embodiments thereof, with reference to the accompanying drawings, in which:

Since FIGS. 1-14 are intended for illustrative purposes, the elements in the drawings are not necessarily drawn to scale. For example, some of the elements may be enlarged or exaggerated for clarity of description.

DETAILED DESCRIPTION OF EMBODIMENTS

Figure 1:
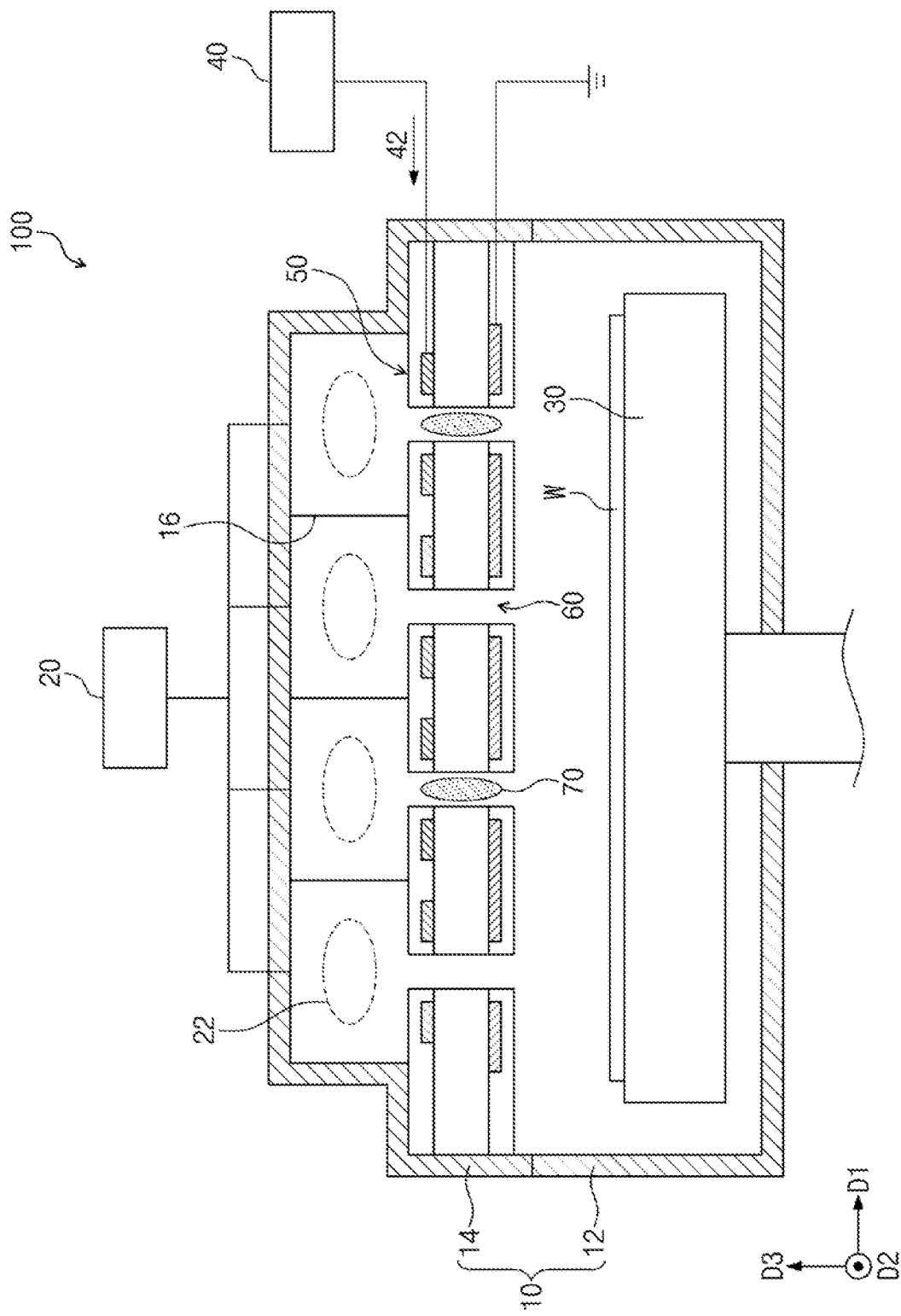
FIG. 1 illustrates an apparatus for manufacturing a semiconductor device according to an exemplary embodiment of the present inventive concept.

FIG. 1 illustrates an apparatus for manufacturing a semiconductor device according to an exemplary embodiment of the present inventive concept.

FIG. 1 illustrates an apparatus 100 for manufacturing a semiconductor device according to an exemplary embodiment of the present inventive concept.

Referring to FIG. 1, the apparatus 100 for manufacturing a semiconductor device according to an exemplary embodiment of the present inventive concept may be or include a substrate etching apparatus or a thin-layer deposition apparatus. In an exemplary embodiment of the present inventive concept, the semiconductor device manufacturing apparatus 100 may include a chamber 10, a gas supply 20, an electrostatic chuck 30, a bias power supply 40, and a hollow cathode 50. A substrate W may be provided in the chamber 10. The substrate may be disposed on the electrostatic chuck 30. The gas supply 20 may provide a reaction gas 22 into the chamber 10. For example, the reaction gas 22 may be injected above the hollow cathode 50. The substrate W may be loaded on the electrostatic chuck 30. The bias power supply 40 may provide the hollow cathode 50 with a bias power 42. The hollow cathode 50 may use the bias power 42 to generate plasma 70 of the reaction gas 22. The substrate W may receive the plasma 70. The plasma 70 may be selectively pixelated to locally etch the substrate W. Thus, the etching rates of the substrate by the plasma 70 may vary across different locations of the substrate W. The pixelated plasma 70 will be described in more detail below.

The chamber 10 may provide the substrate W with an isolated space from the outside. Thus, the chamber may be a sealed, airtight space that is isolated from the air outside the chamber. For example, the chamber 10 may have a pressure of about $10^{-3}$ Torr. In an exemplary embodiment of the present inventive concept, the chamber 10 may include a lower housing 12 and an upper housing 14. The upper housing 14 may be combined onto the lower housing 12. The upper housing 14 may have partitions 16. The partitions 16 may separate the upper housing into a plurality of chambers above the hollow cathode 50. The lower housing 12 may be separated from the upper housing 14. As an example, when the lower housing 12 and the upper housing 14 are separated from each other, the substrate W may be positioned on the electrostatic chuck 30. The upper housing 14 and the lower housing 12 may be combined to each other (e.g., after the substrate W is positioned on the electrostatic chuck 30).

The gas supply 20 may be connected with the upper housing 14. The gas supply 20 may supply the reaction gas 22 to flow between the partitions 16 of the upper housing 14. The plasma 70 may be generated between the partitions 16 (e.g., in the cathode holes 60). The partitions 16 may separate the plasma 70 formed in cathode holes 60 that are spaced apart from each other. The reaction gas 22 may include an etching gas (e.g., $SF_6$, HF, HCl, HBr, or $CH_4$) of the substrate W, an inert gas (e.g., Ar or He), or a purge gas (e.g., $N_2$) (e.g., when the semiconductor device manufacturing apparatus 100 is a substrate etching apparatus). Alternatively, the reaction gas 22 may include a deposition gas (e.g., $SiH_4$, NO, $O_2$, or $NH_3$) (e.g., when the semiconductor device manufacturing apparatus 100 is a thin-layer deposition apparatus).

The electrostatic chuck 30 may be positioned in the lower housing 12. The electrostatic chuck 30 may use an electrostatic force to hold the substrate W. The electrostatic chuck 30 may have a plasma electrode that concentrates the plasma 70 onto the substrate W.

The bias power supply 40 may be positioned outside the chamber 10. The bias power supply 40 may be connected to the hollow cathode 50. The bias power 42 produced from the bias power supply 40 may control intensity of the plasma 70. When the bias power 42 rises, the intensity of the plasma 70 may increase.

The hollow cathode 50 may be disposed in the upper housing 14. Alternatively, the hollow cathode 50 may be disposed in the lower housing 12. The hollow cathode 50 may extend along a direction parallel to an extending direction of the electrostatic chuck 30 and/or the substrate W (e.g., a first direction D1). The hollow cathode 50 may have a thickness greater than that of the electrostatic chuck 30 and/or that of the substrate W (e.g., along a direction perpendicular to the first direction, such as, for example, a third direction D3).

Figure 2:
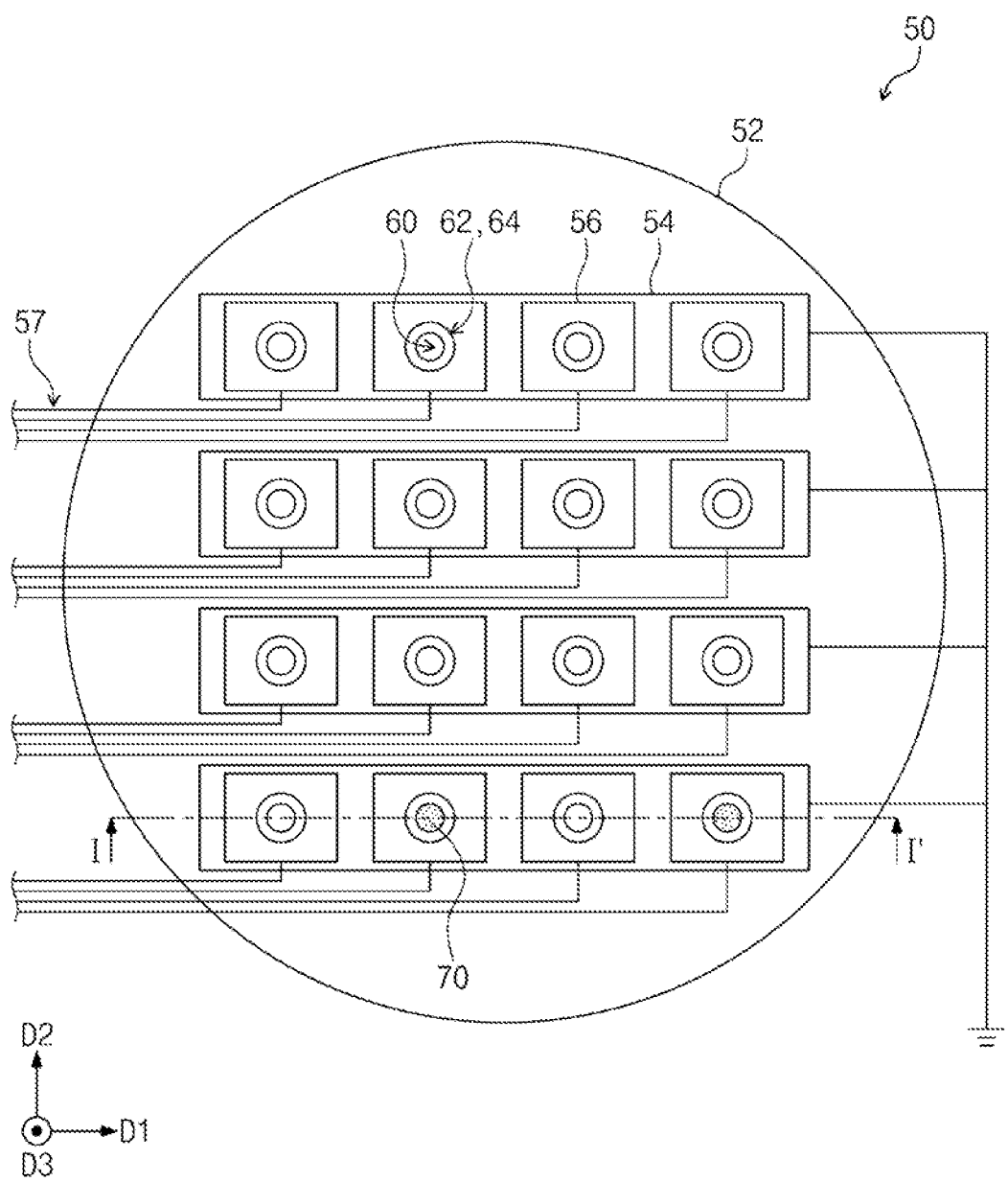
FIG. 2 is a plan view of the hollow cathode of in FIG. 1 according to an exemplary embodiment of the present inventive concept.
Figure 3:
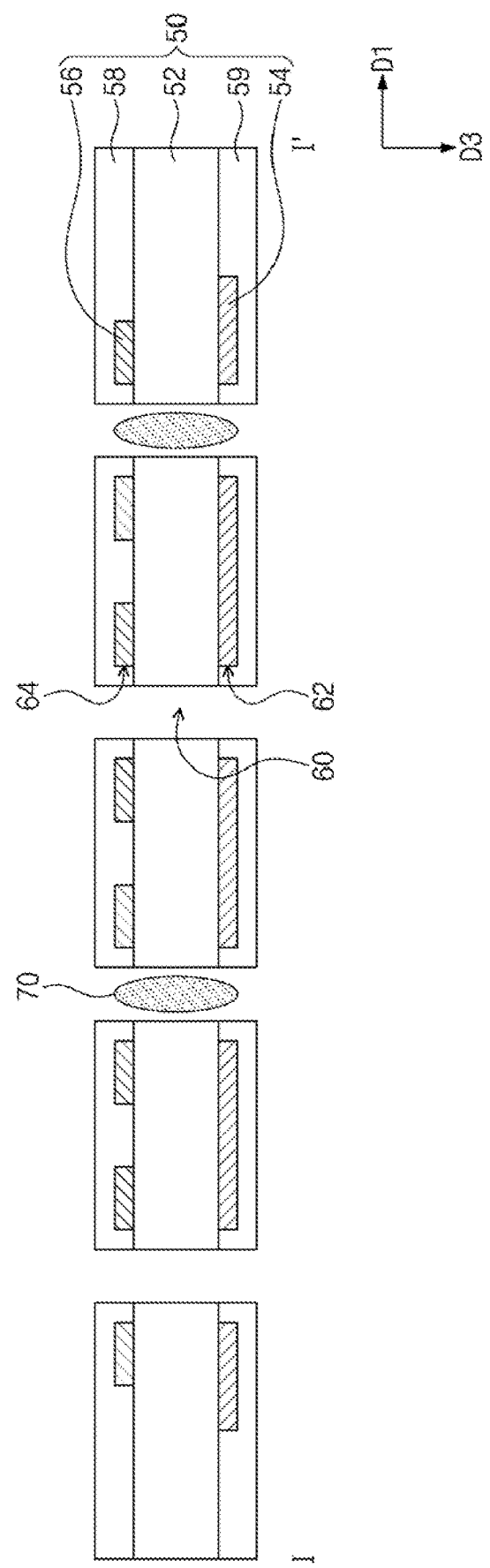
FIG. 3 is a cross-sectional view taken along line I-I' of FIG. 2.

FIG. 2 is a plan view of the hollow cathode of in FIG. 1 according to an exemplary embodiment of the present inventive concept. FIG. 3 is a cross-sectional view taken along line I-I' of FIG. 2.

FIG. 2 illustrates an example of a hollow cathode 50 of FIG. 1. FIG. 3 is a cross-sectional view taken along line I-I' of FIG. 2.

Referring to FIGS. 2 and 3, the hollow cathode 50 may include an insulation plate 52, bottom electrodes 54, top electrodes 56, upper electrical lines 57, an upper protection layer 58, and a lower protection layer 59.

The insulation plate 52 may be a circular disc including a ceramic dielectric (e.g. $Al_2O_3$, $Y_2O_3$). The insulation plate 52 may have cathode holes 60. The cathode holes 60 may allow the reaction gas 22 on the insulation plate 52 to pass through toward the substrate W. For example, the reaction gas may pass from a region of the upper housing 14 toward a region of the lower housing 12 (e.g., between the partitions 16). The plasma 70 may be generated in the cathode holes 60. The plasma 70 may etch the substrate W. Each of the cathode holes 60 may have substantially a same width as that of a plasma sheath (e.g., along the first direction D1). For example, each of the cathode holes 60 may have a width (e.g., a diameter) of about 0.5 mm.

The bottom electrodes 54 may be disposed below or on the insulation plate 52. Each of the bottom electrodes 54 may have a bar shape (e.g., a rectangular shape) extending in the first direction D1. The bottom electrodes 54 may be spaced apart from each other in a second direction D2. The second direction D2 may be perpendicular to the first direction D1. Thus, the third direction D3 may be orthogonal to the first and second direction D1 and D2. Alternatively, the bottom electrodes 54 may be separated from each other in the first and second directions D1 and D2, thus forming a matrix or grid shape. As an example, the bottom electrodes 54 may each be electrically grounded. The bottom electrodes 54 may define first holes 62. The first holes 62 may be aligned with the cathode holes 60 (e.g., along the third direction D3). The first holes 62 may be larger than the cathode holes 60 (e.g., the first holes 62 may be wider than the cathode holes 60 in the first direction D1). The cathode holes 60 may overlap the first holes 62, when viewed in a plan view (e.g., along the third direction D3).

The top electrodes 56 may be disposed above or on the insulation plate 52. For example, the top electrode 56 may be in direct contact with an upper surface of the insulation plate 52. The top electrodes 56 may overlap (e.g., may be aligned with) the bottom electrodes 54 along the third direction D3. The top electrodes 56 may be separated from each other in the first and second directions D1 and D2, thus forming a matrix or grid shape. Each of the top electrodes 56 may have a rectangular island shape. The top electrodes 56 may have second holes 64. The second holes 64 may be positioned between adjacent top electrodes 56. The second holes 64 may overlap the first holes 62 (e.g., may be aligned with) the first holes 62 along the third direction D3.

The upper electrical lines 57 may connect the top electrodes 56 to the bias power supply 40 (see, e.g., FIG. 1). When the bottom electrodes 54 are electrically grounded, the bias power supply 40 may individually provide the bias power 42 through the upper electrical lines 57 to each of the top electrodes 56. Thus, a bias power 42 may be individually provided to each of the top electrodes 56. For example, only one top electrode of the top electrodes 56 might receive the bias power 42, or less than all top electrodes of the top electrodes 56 may receive the bias power 42. The upper electrical lines 57 may be disposed between the top electrodes 56, when viewed in a plan view (e.g., when viewed along the third direction D3).

The upper protection layer 58 may cover the top electrodes 56, the upper electrical lines 57, and the insulation plate 52. The upper protection layer 58 may protect the top electrodes 56 and the upper electrical lines 57 from the reaction gas 22. The upper protection layer 58 may include a ceramic dielectric (e.g. $Al_2O_3$, $Y_2O_3$) or silicon oxide.

The lower protection layer 59 may cover the bottom electrodes 54 and the insulation plate 52. The lower protection layer 59 may protect the bottom electrodes 54 from the reaction gas 22. The lower protection layer 59 may include a ceramic dielectric (e.g. $Al_2O_3$, $Y_2O_3$) or silicon oxide. When the insulation plate 52 includes the upper protection layer 58 and the lower protection layer 59, the insulation plate 52 may be provided therein with the bottom electrodes 54, the top electrodes 56, and the upper electrical lines 57.

Figure 4:
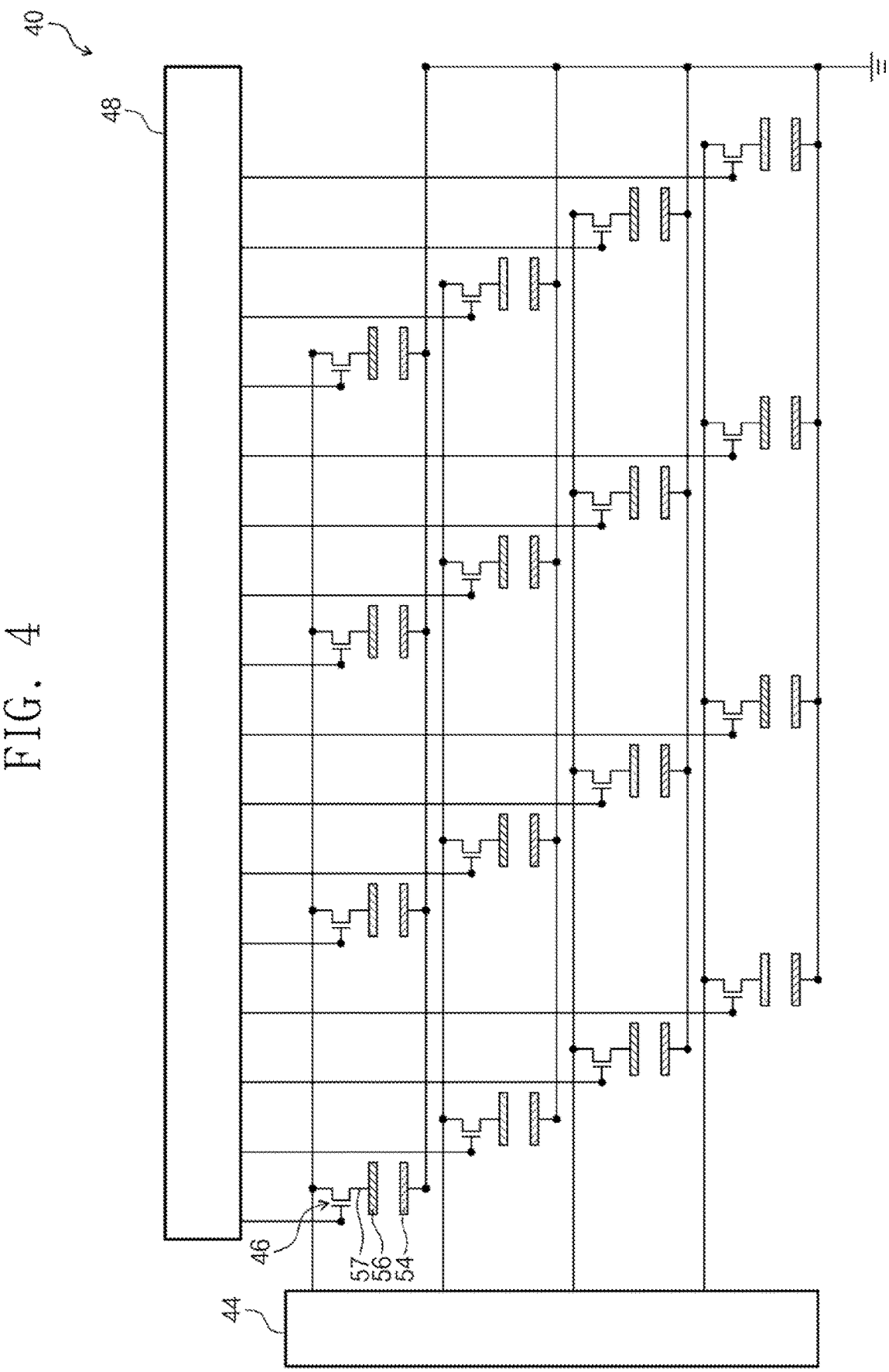
FIG. 4 is a circuit diagram of a bias power supply of FIG. 1.

FIG. 4 is a circuit diagram of a bias power supply of FIG. 1 according to an exemplary embodiment of the present inventive concept.

FIG. 4 illustrates an example of the bias power supply 40 of FIG. 1.

Referring to FIGS. 2 and 4, in an exemplary embodiment of the present inventive concept, the bias power supply 40 may include a bias power source 44, switching elements 46, and a bias driver 48. The bias power source 44 may produce the bias power 42. The switching elements 46 may be connected between the bias power source 44 and the top electrodes 56 of the hollow cathode 50. Each of the switching elements 46 may include at least one switch. The at least one switch may be disposed between the bias power source 44 and the top electrodes 56. The at least one switch may be configured to individually turn on and/or off a bias power provided to at least one top electrode of the top electrodes 56. The upper electrical lines 57 may connect the top electrodes 56 to the switching elements 46. The bias driver 48 may be individually connected to the switching elements 46. The bias driver 48 may produce turn-on signals of the switching elements 46. In response to the turn-on signals, the switching elements 46 may control the bias power 42 applied to the top electrodes 56. When the bottom electrodes 54 are electrically grounded, the bias power supply 40 may individually provide the bias power 42 to the top electrodes 56.

Figure 5:
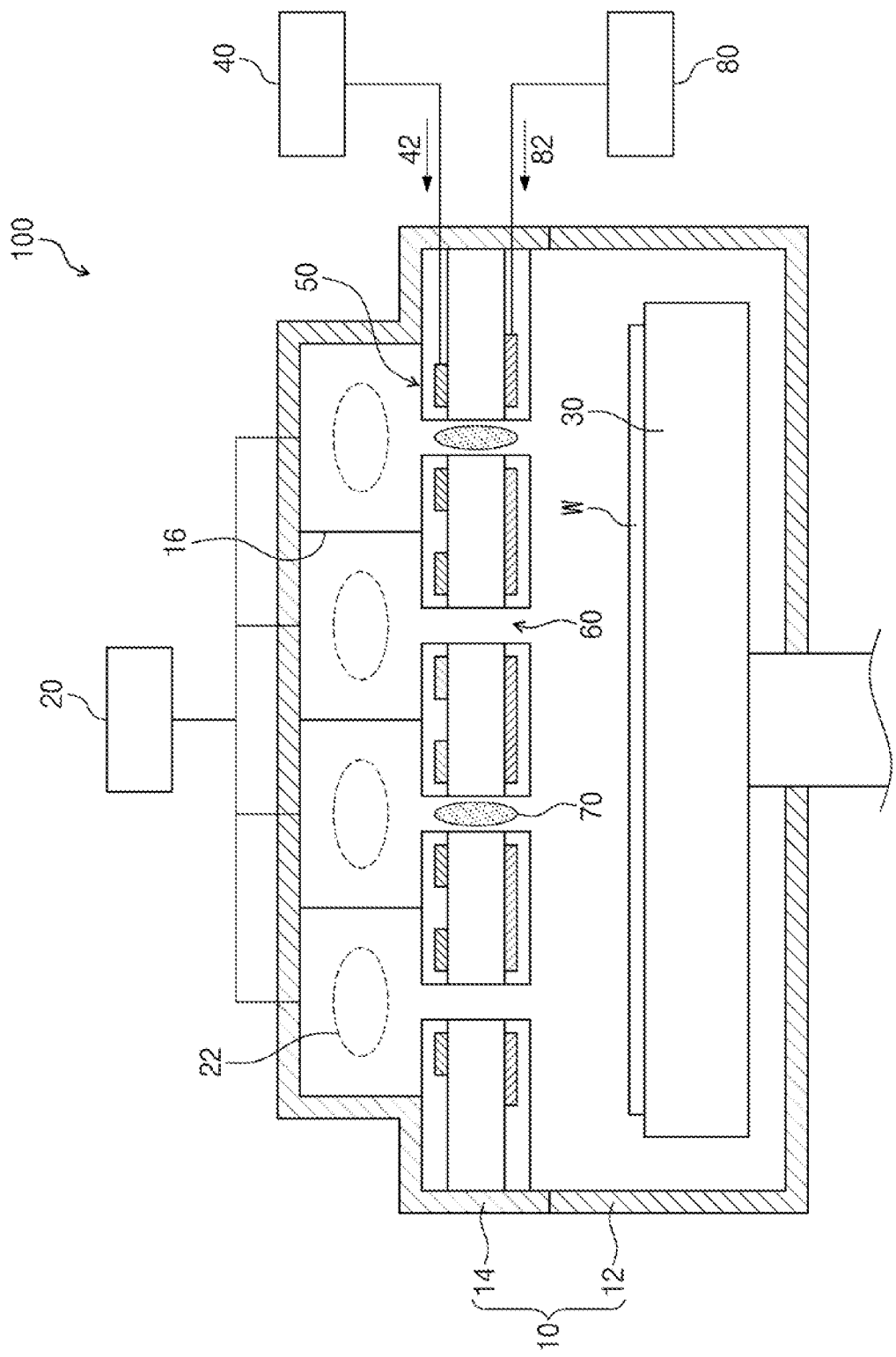
FIG. 5 is a schematic diagram of an apparatus for manufacturing a semiconductor device according to an exemplary embodiment of the present inventive concept.

FIG. 5 is a schematic diagram of an apparatus for manufacturing a semiconductor device according to an exemplary embodiment of the present inventive concept.

FIG. 5 is an example of an apparatus for manufacturing a semiconductor device according to an exemplary embodiment of the present inventive concept. Like reference numerals may refer to like elements throughout the specification and drawings. Descriptions of components illustrated in FIG. 5 that are the same or substantially the same as those described above with reference to FIGS. 1 to 3 may be omitted below.

Referring to FIG. 5, an apparatus 100 for manufacturing a semiconductor device may include a source power supply 80. The source power supply 80 may provide the hollow cathode 50 with a source power 82. The source power 82 may have voltage polarity opposite to that of the bias power 42. For example, when the bias power 42 has a positive voltage, the source power 82 may have a negative voltage. When the bias power 42 and the source power 82 are applied, the plasma 70 may be generated in the cathode holes 60 of the hollow cathode 50. The plasma 70 may etch the substrate W.

Figure 6:
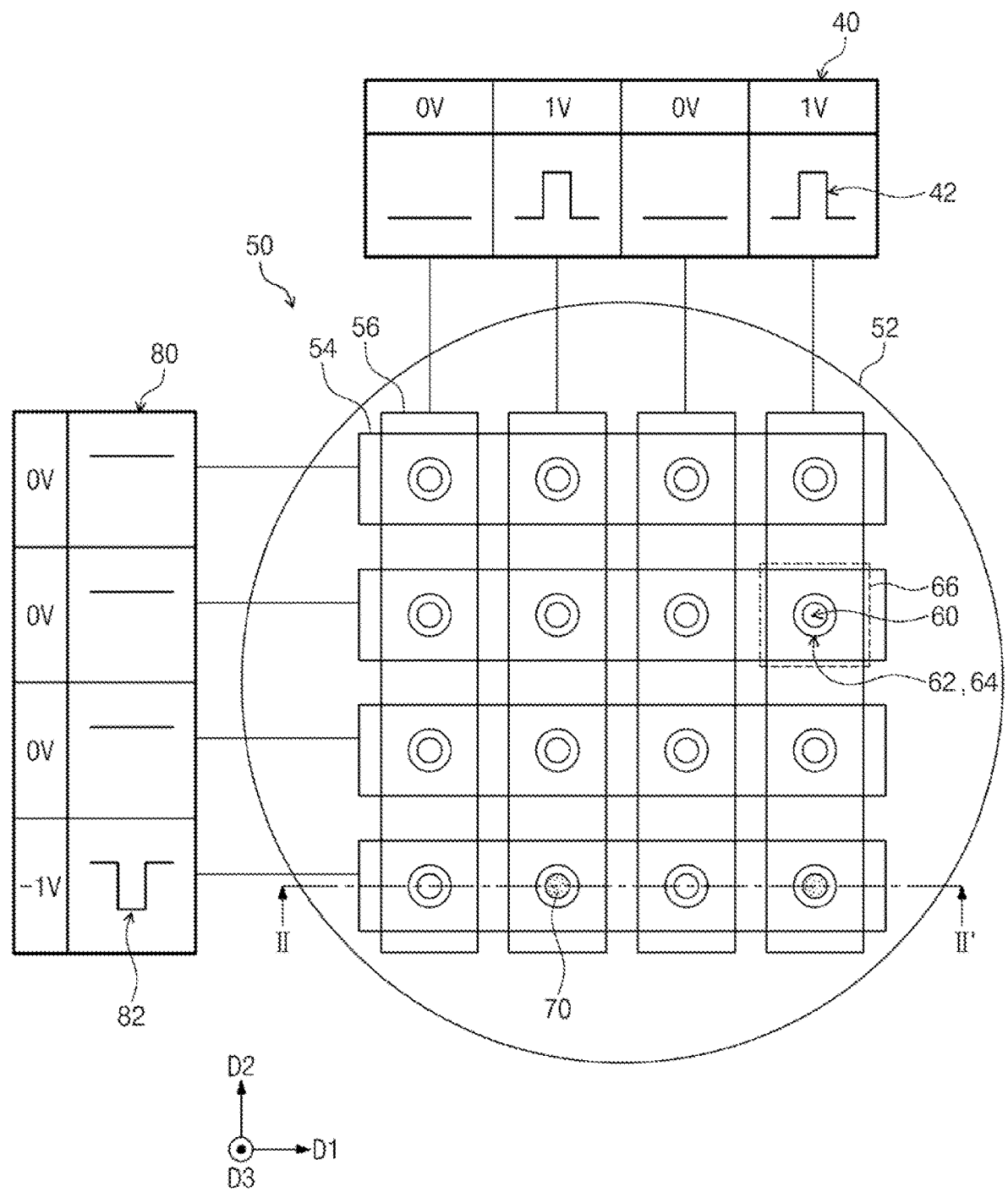
FIG. 6 is a plan view of a hollow cathode, a bias power supply, and a source power supply of FIG. 5 according to an exemplary embodiment of the present inventive concept.
Figure 7:
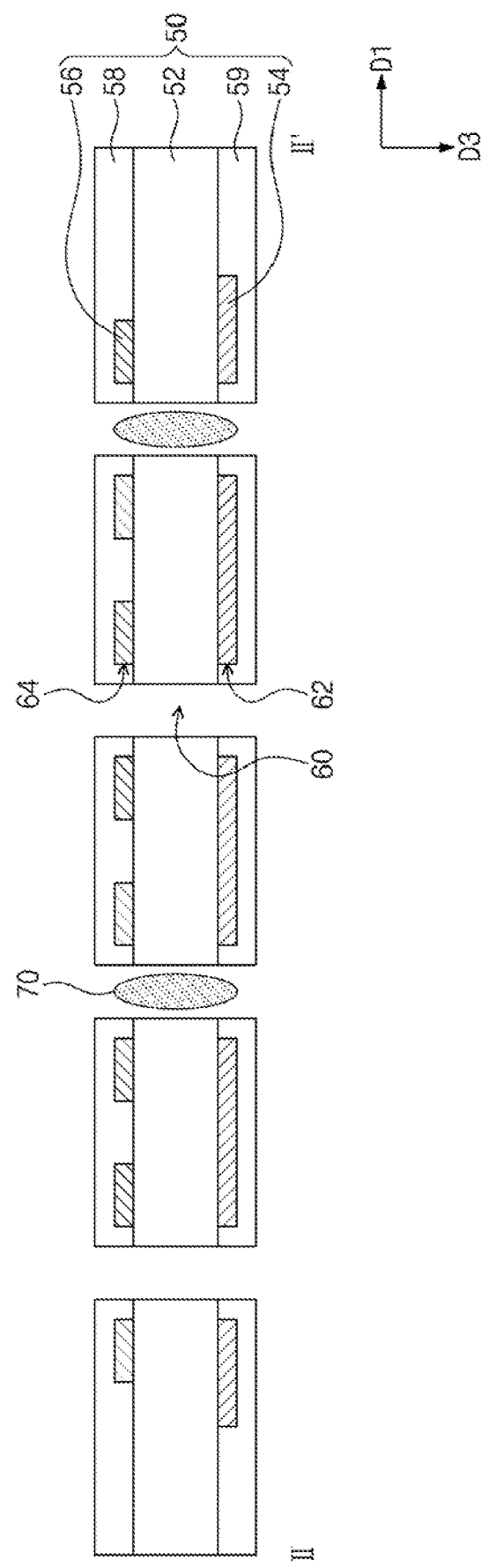
FIG. 7 is a cross-sectional view taken along line II-II' of FIG. 6.

FIG. 6 is a plan view of a hollow cathode, a bias power supply, and a source power supply of FIG. 5 according to an exemplary embodiment of the present inventive concept. FIG. 7 is a cross-sectional view taken along line II-II' of FIG. 6.

FIG. 6 illustrates an example of the hollow cathode 50, the bias power supply 40, and the source power supply 80 of FIG. 5. FIG. 7 is a cross-sectional view taken along line II-II' of FIG. 6.

Referring to FIGS. 6 and 7, each of the bottom electrodes 54 of the hollow cathode 50 may have a bar shape (e.g., a rectangular shape) extending in the first direction D1. Each of the bottom electrodes 54 may be connected with the source power supply 80. The source power supply 80 may sequentially and/or individually provide the source power 82 to the bottom electrodes 54.

Each of the top electrodes 56 may have a bar shape (e.g., a rectangular shape) extending in the second direction D2. Each of the top electrodes 56 may be connected with the bias power supply 40. The top electrodes 56 may be separated from each other in the first direction D1. The bias power supply 40 may sequentially and/or individually provide the bias power 42 to the top electrodes 56. The cathodes holes 60 and the first and second holes 62 and 64 may be located at intersections 66 between the bottom electrodes 54 and the top electrodes 56.

When the bias power 42 and the source power 82 match each other, the plasma 70 may be generated in the cathode holes 60. For example referring to FIG. 6, when the source power 82 having a voltage of about −1 V is applied to the bottom electrode 54 located first from the bottom, and when the bias power 42 having a voltage of about 1 V is applied to the top electrodes 56 located second and fourth from the left, the plasma 70 may be generated in the cathode holes 60 at the intersections 66. The positional information of the intersections 66 at which the plasma 70 is generated may be expressed by coordinate values in which a relative position of a column is expressed as a numerical value starting with "1" on the left and moving right, and a relative position of a row is expressed as a numerical value starting with "1" on the bottom and moving up. For example, referring to FIG. 6, the coordinate values of the intersections 66 at which the plasma 70 is generated may be expressed as coordinate values (2, 1) and (4, 1). Thus, an etch rate of the substrate W may be increased at the coordinate values (2, 1) and (4, 1) where the plasma 70 is generated. Thus, the hollow cathode 50 may be used to locally and selectively etch a substrate in a pinpoint manner (e.g., in a pixelated manner) according to which intersections 66 at which plasma 70 is generated.

Figure 8:
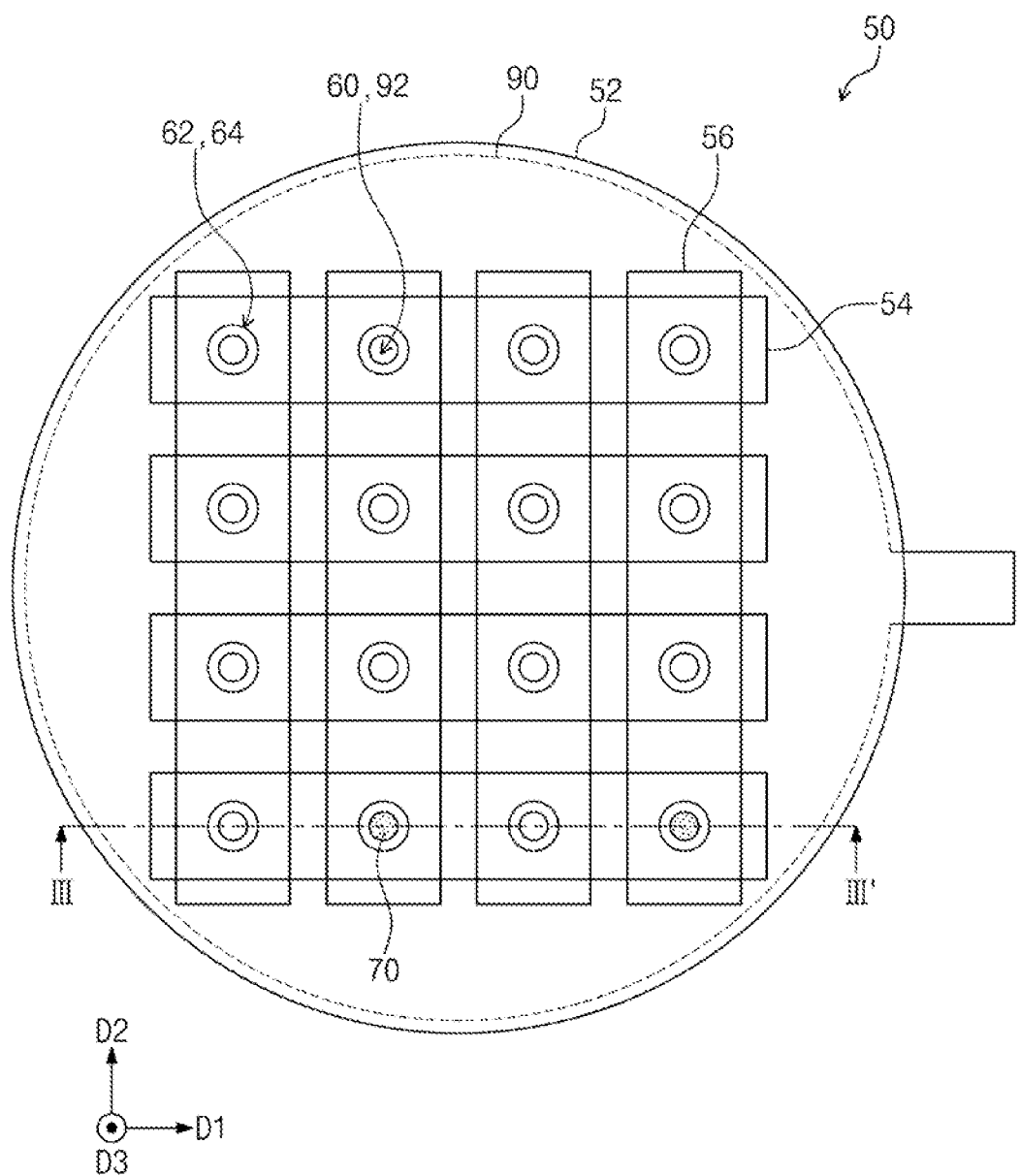
FIG. 8 is a plan of a hollow cathode of FIG. 5 according to an exemplary embodiment of the present inventive concept.
Figure 9:
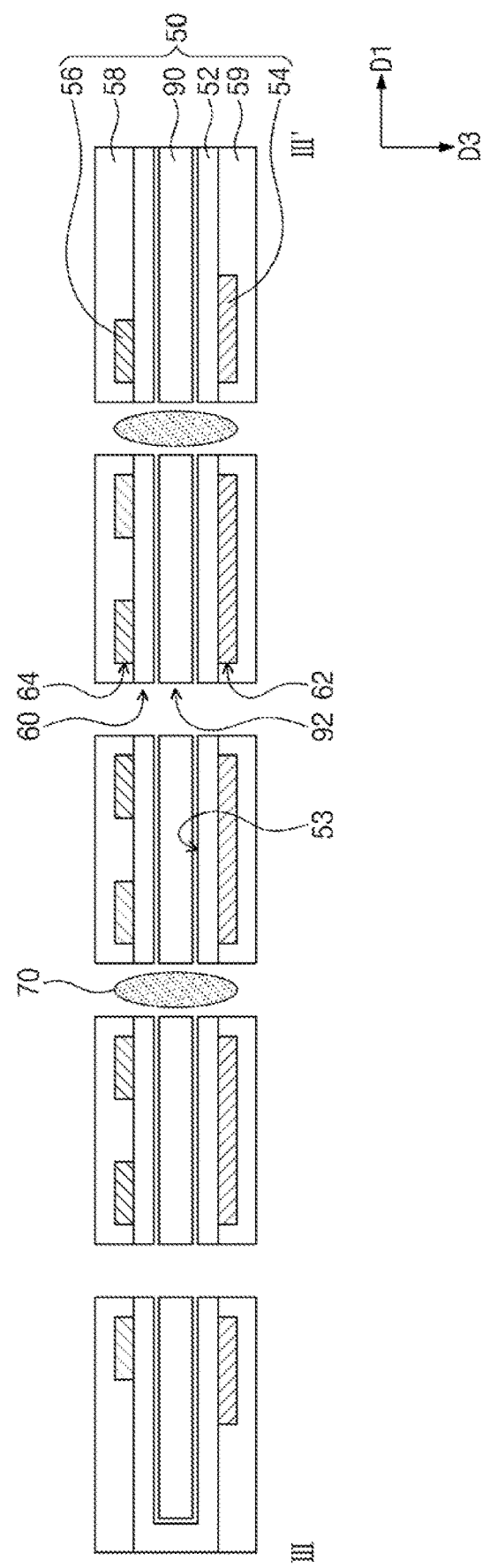
FIG. 9 is a cross-sectional view taken along line III-III' of FIG. 8.

FIG. 8 is a plan of a hollow cathode of FIG. 5 according to an exemplary embodiment of the present inventive concept. FIG. 9 is a cross-sectional view taken along line III-III' of FIG. 8.

FIG. 8 illustrates an example of the hollow cathode 50 of FIG. 5. FIG. 9 is a cross-sectional view taken along line III-III' of FIG. 8.

Referring to FIGS. 8 and 9, the hollow cathode 50 may include a shutter plate 90 in the insulation plate 52. Descriptions of components illustrated in FIGS. 8 and 9 that are the same or substantially the same as those described above with reference to FIGS. 3 to 7 may be omitted below.

The insulation plate 52 may have a gap 53. The gap 53 may be disposed between the bottom electrodes 54 and the top electrodes 56. The gap 53 may extend in a direction intersecting extending directions of the cathode holes 60. For example, the gap 53 may extend in the first direction D1. For example, when the cathode holes 60 extend in the third direction D3, the gap 53 may extend either in the first direction D1 or in the second direction D2.

The shutter plate 90 may be positioned in the gap 53. The shutter plate 90 may have shutter holes 92. The shutter holes 92 may be aligned with the cathode holes 60 (e.g., along the third direction D3). The shutter plate 90 may move or be moveable in the gap 53. For example, the shutter plate 90 may be moveable along the first direction D1 to move along the extending direction of the gap 53. Movement of the shutter plate 90 may open and close the cathode holes 60 by moving the shutter holes 92 into and out of alignment (e.g., along the third direction D3) with the cathode holes 60.

When the source power 82 and the bias power 42 are provided to the bottom electrodes 54 and the top electrodes 56, the plasma 70 may be generated in the cathode holes 60 and the shutter holes 92. For example, the plasma 70 may be generated in the cathode holes 60 and the shutter holes 92 when the cathode holes 60 and the shutter holes 92 are aligned (e.g., along the third direction D3).

Figure 10:
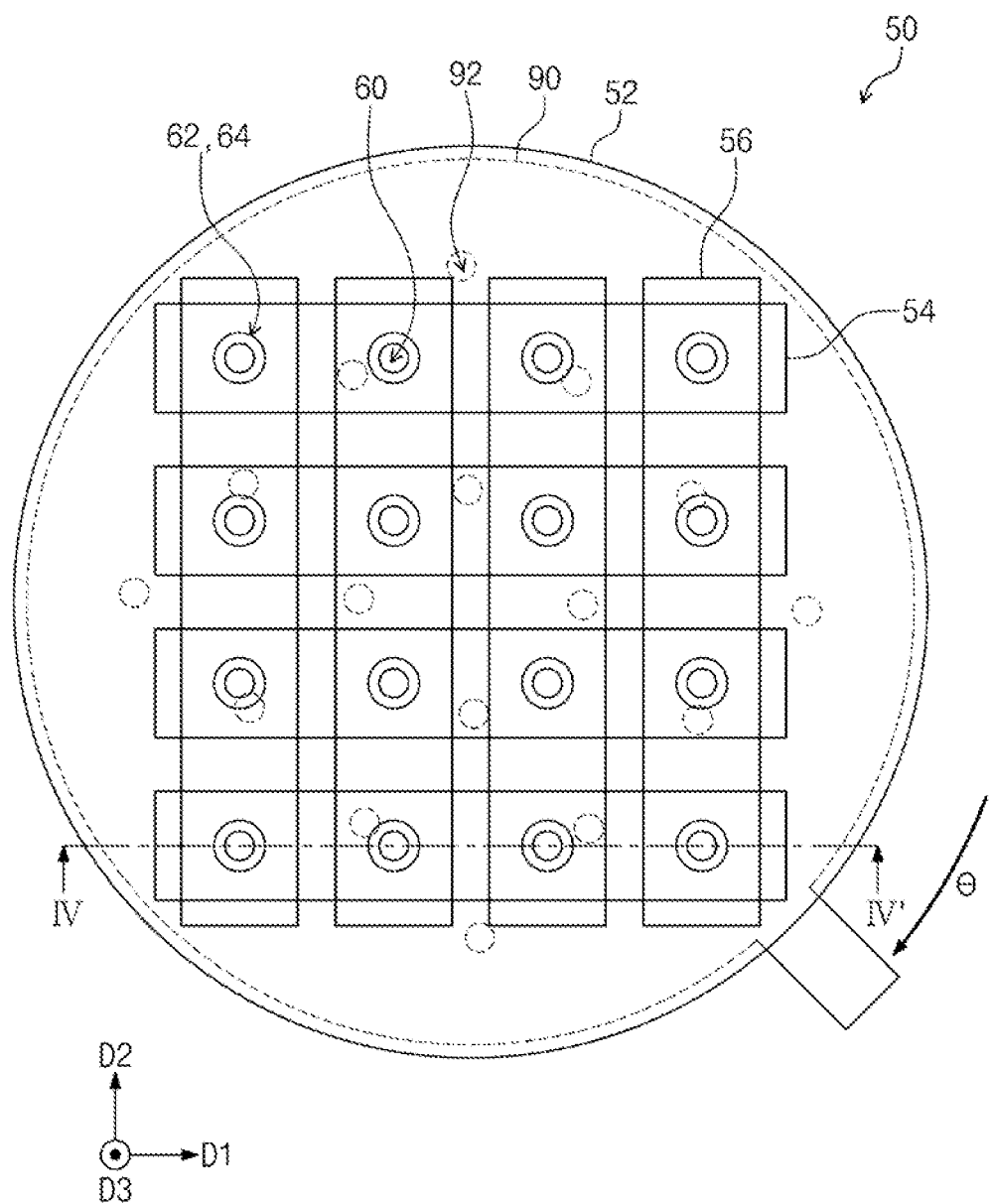
FIG. 10 is a plan view of a shutter plate of FIG. 9 according to an exemplary embodiment of the present inventive concept.
Figure 11:
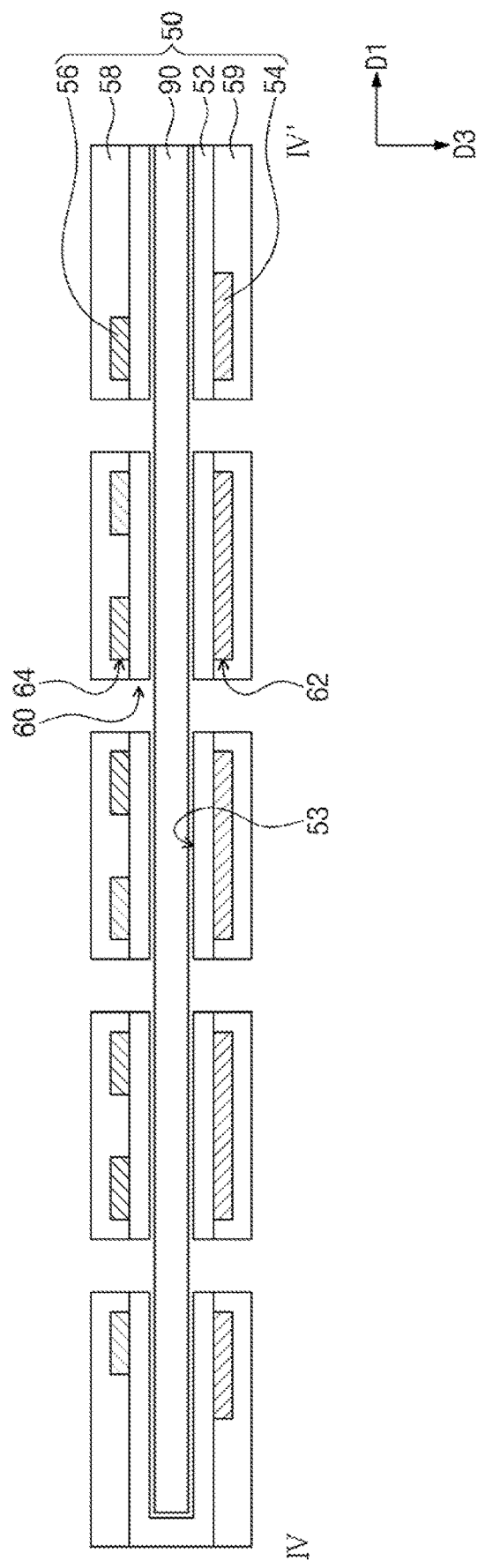
FIG. 11 is a cross-sectional view taken along line IV-IV' of FIG. 10.

FIG. 10 is a plan view of a shutter plate of FIG. 9 according to an exemplary embodiment of the present inventive concept. FIG. 11 is a cross-sectional view taken along line IV-IV' of FIG. 10.

FIG. 10 illustrates an example of the shutter plate 90 that blocks the cathode holes 60 of FIG. 9. FIG. 11 is a cross-sectional view taken along line IV-IV' of FIG. 10.

Referring to FIGS. 1, 10, and 11, the shutter plate 90 may rotate in a direction of azimuth angle θ on a plane defined by the first direction D1 and the second direction D2, thus blocking the cathode holes 60. Thus, the reaction gas 22 does not pass through the cathodes holes 60 when the cathode holes 60 are blocked by the shutter plate 90. Even when the source power 82 and the bias power 42 are provided to the bottom electrodes 54 and the top electrodes 56, the plasma 70 is not generated in the cathode holes 60 when the cathode holes 60 are blocked by the shutter plate 90.

A method of manufacturing a semiconductor device using the semiconductor device manufacturing apparatus 100, as described herein, is described in more detail below.

Figure 12:
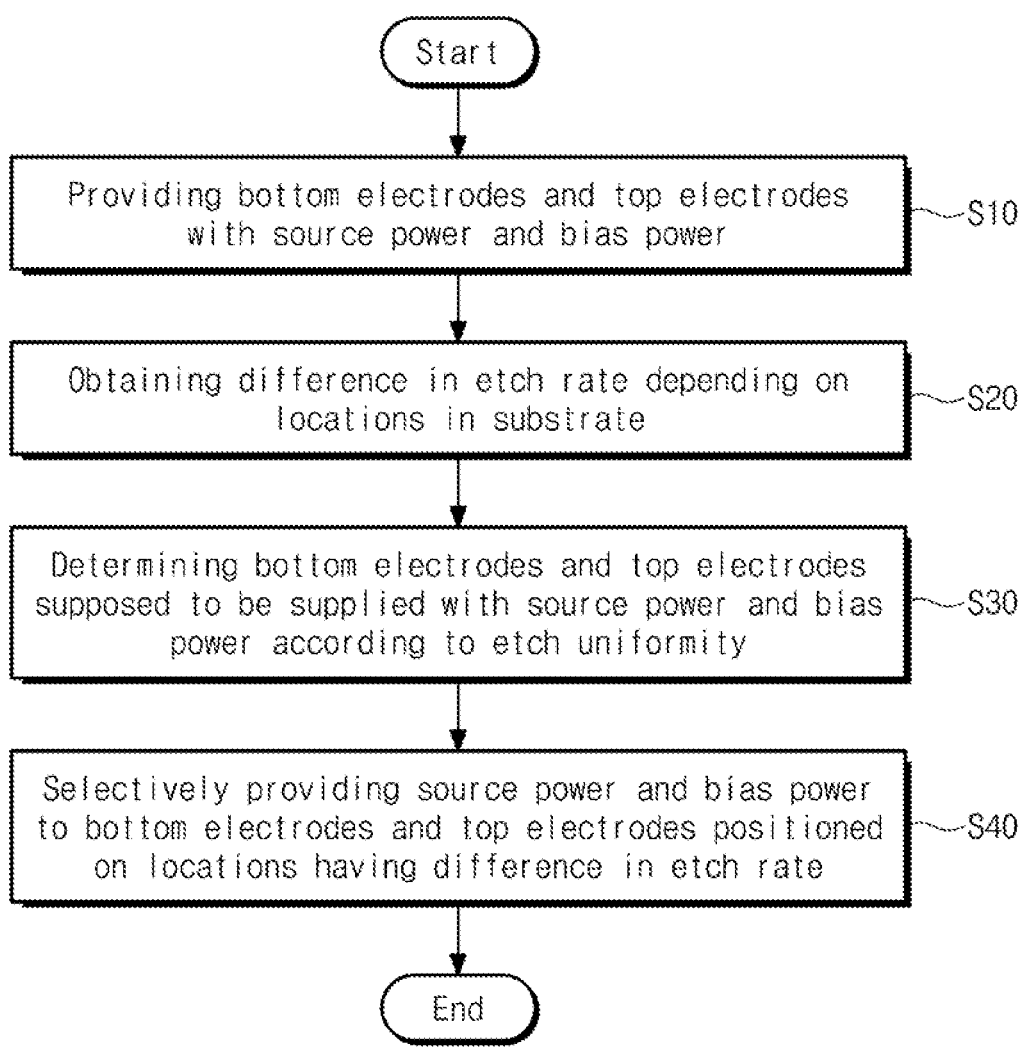
FIG. 12 is a flow chart of a method of manufacturing a semiconductor device according to an exemplary embodiment of the present inventive concept.

FIG. 12 is a flow chart of a method of manufacturing a semiconductor device according to an exemplary embodiment of the present inventive concept.

Referring to FIG. 12, a method of manufacturing a semiconductor device may include providing bottom electrodes and top electrodes with source power and bias power (step S10). For example, the method may include providing the source power 82 and the bias power 42 to the bottom electrodes 54 and the top electrodes 56. The method may include obtaining a difference in etch rate depending on locations in the substrate (step S20). For example, the method may include obtaining etch uniformity depending on locations in the substrate W. The method may include determining locations of bottom electrodes and top electrodes that are supposed to be supplied with source power and bias power according to etch uniformity (step S30). For example, the method may include determining locations of the bottom electrodes 54 and the top electrodes 56 that are supposed to be supplied with the source power 82 and the bias power 42 according to the etch uniformity. The method may include selectively providing source power and bias power to bottom electrodes and top electrodes positioned on locations having a difference in etch rate (step S40). For example, the method may include selectively providing the source power 82 and the bias power 42 to the bottom electrodes 54 and the top electrodes 56.

The source power supply 80 and the bias power supply 40 may provide the source power 82 and the bias power 42 to the bottom electrodes 54 and the top electrodes 56, thus etching the substrate W (e.g., in step S10). The bias power 42 and the source power 82 may generate the plasma 70 in all of the cathode holes 60. The plasma 70 may etch an entire top surface of the substrate W. Alternatively, the plasma 70 may deposit a thin layer on the substrate W. For example, as described herein, plasma 70 may be generated in less than all of the cathode holes 60 to generate the plasma 70 selectively in some of the cathode holes 60 to selectively etch the substrate W.

Figure 13:
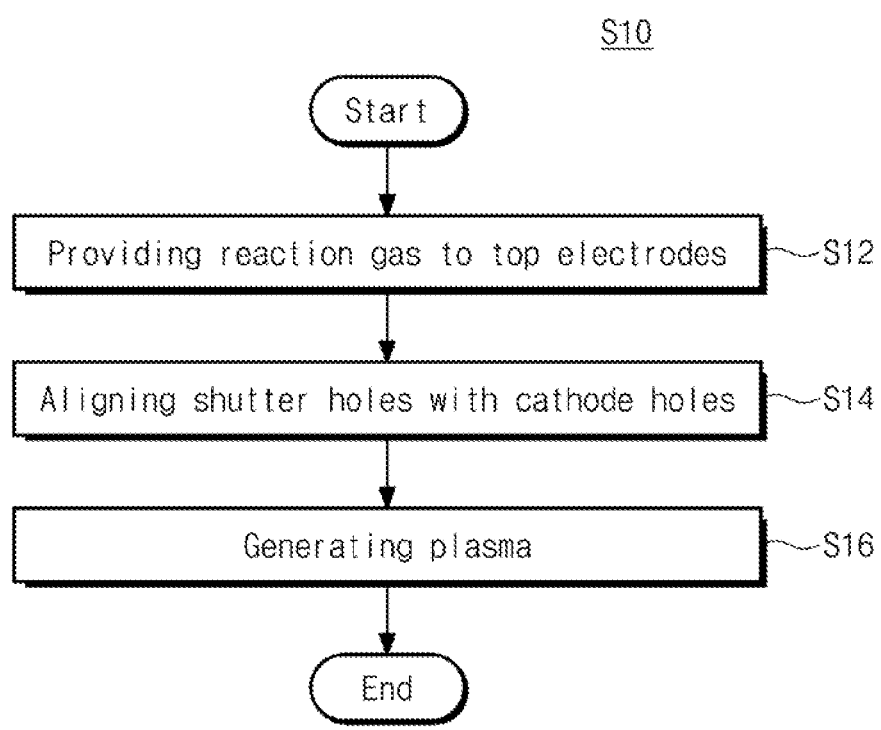
FIG. 13 is a flow chart of a substrate etching step of FIG. 12.

FIG. 13 is a flow chart of a substrate etching step of FIG. 12 according to an exemplary embodiment of the present inventive concept.

FIG. 13 is an example of the substrate etching step S10 of FIG. 12.

Referring to FIG. 13, step S10 may include etching the substrate W. For example, in step S1, etching the substrate W may include providing a reaction gas to top electrodes (step S12). For example, step S12 may include supplying the reaction gas 22 onto the top electrodes 56. Step S10 may include aligning shutter holes with cathode holes (step S14). For example, step S14 may include aligning the shutter holes 92 with the cathode holes 60, and generating plasma (step S16). Thus, step S16 may include generating the plasma 70.

The gas supply 20 may supply the reaction gas 22 onto the top electrodes 56 (e.g., in step S12). The upper housing 14 may be filled with the reaction gas 22.

A controller and/or human operator may rotate the shutter plate 90 to align the shutter holes 92 with the cathode holes 60 (e.g., in step S14). The reaction gas 22 may be provided into the cathodes holes 60 and the shutter holes 92.

The source power supply 80 and the bias power supply 40 may provide the source power 82 and the bias power 42 to the bottom electrodes 54 and the top electrodes 56, and thus the plasma 70 may be generated in (e.g., in some of or in all of) the cathode holes 60 (e.g., in step S16). The plasma 70 may produce ions (e.g., H+, F+) and/or free radicals (e.g., H, F, Cl·, CH₃·). The ions and free radicals of the reaction gas 22 may etch the substrate W.

Referring to FIG. 12, when the etching of the substrate W is complete, an inspection apparatus may inspect the substrate W to obtain the etch uniformity of the substrate W (e.g., in step S20). The etch uniformity may include a difference in etch rate based on locations in the substrate W.

The controller may determine the bottom electrodes 54 and the top electrodes 56 that are supposed to be supplied with the source power 82 and the bias power 42 on the basis of the etch uniformity (e.g., in step S30). The controller may compare coordinate values indicating positional information about portions of the substrate W to coordinate values in the hollow cathode 50. When coordinate values are given to indicate positional information about specific portions of the substrate W that have an etch rate less than an average etch rate of the substrate W, the controller may obtain coordinate values indicating positional information about the intersections 66 of the hollow cathode 50 that correspond to the coordinate values indicating the specific portions of the substrate W. The controller may choose the bottom and top electrodes 54 and 56 crossing at the intersections 66 at which etch values were less than average. Accordingly, the controller may determine the bottom electrodes 54 and the top electrodes 56 that are supposed to be supplied with the source power 82 and the bias power 42. Alternatively, the controller may obtain intensities of the source power 82 and the bias power 42 according to the difference in etch rate. When a particular portion of the substrate W is etched less than the average etch rate, the controller may increase the intensities of the source power 82 and the bias power 42. In contrast, when a particular portion of the substrate W is etched more than the average etch rate, the controller may decrease the intensities of the source power 82 and the bias power 42. Thus, the hollow cathode 50 may be used to locally and selectively etch a substrate in a pinpoint manner (e.g., in a pixelated manner) by increasing and decreasing etch rates of the substrate W according to which intersections 66 at which plasma 70 is generated.

The source power supply 80 and the bias power supply 40 may selectively provide the source power 82 and the bias power 42 to the bottom electrodes 54 and the top electrodes 56 expressed by coordinate values having the difference in etch rate (e.g., in step S40). For example, the plasma 70 may etch portions of the substrate W that have a relatively low etch rate (e.g., an etch rate that is less than an average etch rate). Accordingly, the etching uniformity of the substrate W may be increased. In an exemplary embodiment of the present inventive concept, the semiconductor device manufacturing apparatus 100 may include a plasma CVD apparatus. The semiconductor device manufacturing apparatus 100 may use the plasma 70 to increase deposition uniformity of thin layers.

Figure 14:
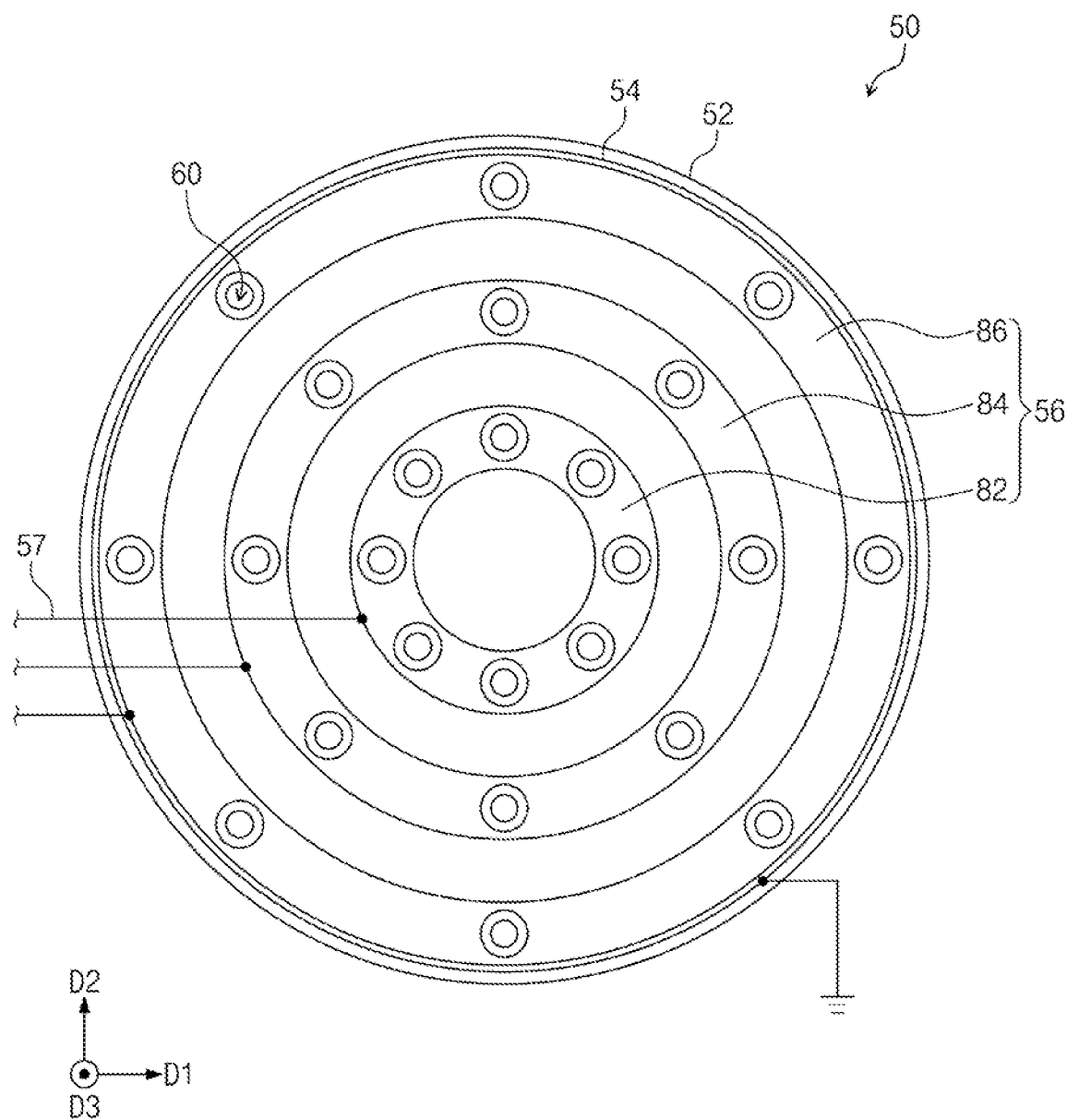
FIG. 14 is a plan view of a cathode of FIG. 1 according to an exemplary embodiment of the present inventive concept.

FIG. 14 is a plan view of a cathode of FIG. 1 according to an exemplary embodiment of the present inventive concept.

FIG. 14 is an example of the hollow cathode 50 of FIG. 1.

Referring to FIGS. 3 and 14, the hollow cathode 50 may include a plate-shaped (e.g., a circular plate-shaped) bottom electrode 54 and concentric ring-shaped top electrodes 56. The insulation plate 52 may be substantially the same as the insulation plate 52 described above with reference to FIG. 2.

The bottom electrode 54 may cover (e.g., may overlap along the third direction D3) substantially the entire top surface of the substrate W. The top electrodes 56 may be separated from each other. For example, the top electrodes 56 may be separated from each other in a radius direction of the substrate W, and may be connected to the upper electrical lines 57. In an exemplary embodiment of the present inventive concept, the top electrodes 56 may include a central ring 82, a middle ring 84, and an edge ring 86.

The central ring 82 may be disposed inside the middle ring 84 (e.g., when viewed in a plan view along the third direction D3). The central ring 82 may overlap a central region of the substrate W (e.g., when viewed in a plan view along the third direction D3). When the central ring 82 is provided with the bias power (e.g., bias power 42 described above), the plasma 70 may be generated in the cathode holes 60 provided in the central ring 82. The plasma 70 may selectively and/or locally etch the central region of the substrate W.

The middle ring 84 may be provided between the central ring 82 and the edge ring 86. The middle ring 84 may be disposed on a middle region between central and edge regions of the substrate W. When the middle ring 84 is provided with the bias power 42, the plasma 70 may be generated in the cathode holes 60 provided in the middle ring 84. The plasma 70 may selectively and/or locally etch the middle region of the substrate W.

The edge ring 86 may surround the middle ring 84. The edge ring 86 may be disposed on the edge region of the substrate W. When the edge ring 86 is provided with the bias power 42, the plasma 70 may be generated in the cathode holes 60 provided in the edge ring 86. The plasma 70 may selectively and/or locally etch the edge region of the substrate W. Thus, the hollow cathode 50 may be used to locally and selectively etch a substrate in a pinpoint manner (e.g., in a pixelated manner) by increasing and decreasing etch rates of the substrate W according to which intersections 66 at which plasma 70 is generated.

As discussed above, a difference in intensity of the bias power 42 may be opposite to the difference in etch rate of the substrate W. For example, when the central region has an etch rate greater than that of the edge region, the intensity of the bias power 42 applied to the central ring 82 may be less than the intensity of the bias power 42 applied to the edge ring 86.

According to an exemplary embodiment of the present inventive concept, an apparatus for etching a semiconductor device may include an etching chamber (see, e.g., lower housing 12 of chamber 10 in FIG. 1) and the electrostatic chuck 30 positioned in the etching chamber. A plurality of reaction gas chambers (see, e.g., upper housing 14 of chamber 10 in FIG. 1 including partitions 16) may be positioned above the etching chamber. Each of the reaction gas chambers may be individually connected to the gas supply 20. The reaction gas chambers may be separated from each other by partitions 16. The hollow cathode 50 may be positioned between the etching chamber and the plurality of reaction gas chambers. The hollow cathode 50 may include a plurality of cathode holes 60 positioned over the electrostatic chuck 30. The hollow cathode 50 may include upper and lower electrodes (e.g., 54 and 56) adjacent to each cathode hole of the plurality of cathode holes 60. The upper and lower electrodes may be disposed on the insulation plate 52. A reaction gas may be individually supplied to each of the reaction gas chambers. Thus, reaction gas chambers positioned above upper and lower electrodes which are not provided with a bias and/or a source power (as described above in more detail) might not be supplied with reaction gas 22. Thus, an amount of reaction gas 22 used may be reduced, manufacturing costs may be reduced and efficiency of semiconductor manufacturing (e.g., etching) may be increased.

An apparatus for manufacturing a semiconductor device according to an exemplary embodiment of the present inventive concept may include the bottom and top electrodes intersecting at the cathode holes of the insulation plate. The bottom electrodes and the top electrodes may use the source power and the bias power to generate the pixelated plasma in the cathode holes. The pixelated plasma may locally etch the substrate, thus increasing etch uniformity of a substrate.

While the inventive concept has been particularly shown and described with reference to exemplary embodiments thereof, it will be understood by those of ordinary skill in the art that various changes in form and detail may be made therein without departing from the spirit and scope of the inventive concept.

What is claimed is:

1. A method of manufacturing a semiconductor device, the method comprising:
    obtaining a measurement of etch uniformity of a substrate by detecting differences in etch rate depending on locations on the substrate;
    determining positions of bottom electrodes and top electrodes of a hollow cathode that are configured to be individually supplied with a source power and a bias power according to the detected differences in etch rate depending on locations on the substrate; and
    locally generating a plasma on the substrate by selectively providing the source power and the bias power to the bottom electrodes and the top electrodes based on the differences in etch rate depending on locations on the substrate,
    wherein the hollow cathode further comprises an insulation plate provided between the bottom electrodes and the top electrodes, the hollow cathode having cathode holes,
    wherein the bottom electrodes have first holes and extend in a first direction,
    wherein the top electrodes have second holes aligned with the first holes and extend in a second direction intersecting the first direction, and
    wherein the cathode holes and the first and second holes are disposed at intersections of the bottom electrodes and the top electrodes.

2. The method of claim 1, wherein the bias power has a positive voltage when the source power has a negative voltage.

3. The method of claim 2, wherein the bias power is provided by a bias power supply.

4. The method of claim 3, wherein the bias power supply comprises:
    a bias power source;
    switching devices connected between the bias power source and the top electrodes; and
    a bias driver connected to the switching devices, the bias driver generating a plurality of turn-on signals of the switching devices.

5. The method of claim 1, wherein the source power is provided by a source power supply.

6. The method of claim 1, wherein the bottom electrodes are separated in the second direction individually and the top electrodes are separated in the first direction individually.

7. The method of claim 1, wherein determining the positions of the bottom electrodes and the top electrodes comprises obtaining intensities of the source and bias powers.

8. The method of claim 1, further comprising etching the substrate by providing the bottom electrodes and the top electrodes with the source power and the bias power.

9. The method of claim 8, wherein etching the substrate comprises:
    supplying a reaction gas onto the top electrodes;
    aligning shutter holes with the cathode holes of the hollow cathode; and
    generating the plasma in the cathode holes and the shutter holes.

10. The method of claim 1, wherein the bottom electrodes comprise first holes surrounding the cathode holes of the hollow cathode, and
    wherein the top electrodes comprise the second holes surrounding the cathode holes.

11. A method of manufacturing a semiconductor device, the method comprising:
    obtaining a measurement of etch uniformity of a substrate by detecting differences in etch rate depending on locations on the substrate;
    determining positions of bottom electrodes and top electrodes of a hollow cathode that are configured to be individually supplied with a source power and a bias power according to the detected differences in etch rate depending on locations on the substrate;
    providing a reaction gas on the top electrodes; and
    locally generating a plasma on the substrate by selectively providing the source power and the bias power to the bottom electrodes and the top electrodes based on the differences in etch rate depending on locations on the substrate,
    wherein the hollow cathode further comprises an insulation plate provided between the bottom electrodes and the top electrodes, the hollow cathode having cathode holes,
    wherein the bottom electrodes have first holes, the bottom electrodes arranged in a straight line,
    wherein the top electrodes have second holes aligned with the first holes, the top electrodes arranged in a circle shape different from the straight line, and
    wherein the cathode holes and the first and second holes are disposed at intersections of the bottom electrodes and the top electrodes.

12. The method of claim 11, wherein the bias power is provided by a bias power supply and the source power is provided by a source power supply.

13. The method of claim 12, wherein the bias power supply comprises:
    a bias power source;
    switching devices connected between the bias power source and the top electrodes; and
    a bias driver connected to the switching devices, the bias driver generating a plurality of turn-on signals of the switching devices.

14. The method of claim 11, wherein the top electrodes comprise:
    an edge ring;
    a center ring disposed in the edge ring; and
    a middle ring disposed between the center ring and the edge ring.

15. The method of claim 11, wherein determining the positions of the bottom electrodes and the top electrodes comprises obtaining intensities of the source and bias powers.

16. A method of manufacturing a semiconductor device, the method comprising:
- obtaining a measurement of etch uniformity of a substrate by detecting differences in etch rate depending on locations on the substrate;
- determining positions of bottom electrodes and top electrodes of a hollow cathode that are configured to be individually supplied with a source power and a bias power according to the detected differences in etch rate depending on locations on the substrate; and
- locally generating a plasma on the substrate by selectively providing the source power and the bias power to the bottom electrodes and the top electrodes based on the differences in etch rate depending on locations on the substrate,
- wherein the hollow cathode further comprises an insulation plate provided between the bottom electrodes and the top electrodes, the hollow cathode having cathode holes, wherein the top electrodes comprise:
- an edge ring;
- a center ring disposed in the edge ring; and
- a middle ring disposed between the center ring and the edge ring.

17. The method of claim 16, wherein the bias power is provided by a bias power supply and the source power is provided by a source power supply.

18. The method of claim 17, wherein the bias power supply comprises:
- a bias power source;
- switching devices connected between the bias power source and the top electrodes; and
- a bias driver connected to the switching devices, the bias driver generating a plurality of turn-on signals of the switching devices.

19. The method of claim 16, wherein determining the positions of the bottom electrodes and the top electrodes comprises obtaining intensities of the source and bias powers.

20. The method of claim 16, wherein the bias power has a positive voltage when the source power has a negative voltage.

* * * * *